United States Patent
Soloviev et al.

(10) Patent No.: US 12,313,806 B2
(45) Date of Patent: May 27, 2025

(54) DETECTION OF FERROMAGNETIC OBJECTS SUBMERGED IN A BODY OF WATER

(71) Applicant: NOVA SOUTHEASTERN UNIVERSITY, INC., Fort Lauderdale, FL (US)

(72) Inventors: Alexander V. Soloviev, Fort Lauderdale, FL (US); Cayla W. Dean, Fort Lauderdale, FL (US)

(73) Assignee: NOVA SOUTHEASTERN UNIVERSITY, INC., Fort Lauderdale, FL (US)

( * ) Notice: Subject to any disclaimer, the term of this patent is extended or adjusted under 35 U.S.C. 154(b) by 0 days.

(21) Appl. No.: 18/569,108

(22) PCT Filed: Jun. 27, 2022

(86) PCT No.: PCT/US2022/035060
§ 371 (c)(1),
(2) Date: Dec. 11, 2023

(87) PCT Pub. No.: WO2023/146578
PCT Pub. Date: Aug. 3, 2023

(65) Prior Publication Data
US 2024/0280720 A1    Aug. 22, 2024

Related U.S. Application Data

(60) Provisional application No. 63/259,214, filed on Jun. 29, 2021.

(51) Int. Cl.
*G01V 3/08*    (2006.01)
*G01V 3/38*    (2006.01)
(Continued)

(52) U.S. Cl.
CPC ............... *G01V 3/081* (2013.01); *G01V 3/38* (2013.01); *G01C 13/002* (2013.01); *G01R 33/02* (2013.01)

(58) Field of Classification Search
CPC .................................. G01V 3/38; G01V 3/081
See application file for complete search history.

(56) References Cited

U.S. PATENT DOCUMENTS 5,030,913 A * 7/1991 Byram .................... G01V 3/15
702/194
10,088,452 B2 * 10/2018 Villani, Jr. ............. G01N 27/82
(Continued)

FOREIGN PATENT DOCUMENTS

CN    110018231 A    7/2019
JP    2005-345077 A    12/2005

OTHER PUBLICATIONS

International Preliminary Report on Patentability dated Jan. 11, 2024, issued in corresponding International Patent Application No. PCT/US2022/035060.
(Continued)

*Primary Examiner* — Reena Aurora
(74) *Attorney, Agent, or Firm* — Morgan, Lewis & Bockius LLP

(57) ABSTRACT

Systems and methods to detect ferromagnetic objects, particularly submerged, non-naturally occurring ferromagnetic objects, account for contributions to the magnetic field arising from topography, such as magnetic refraction at bathymetric slopes. Removing this topography component of noise from detected total magnetic field enhances detection capability of, for example, naval surveillance systems.

16 Claims, 5 Drawing Sheets

(51) Int. Cl.
  *G01C 13/00* (2006.01)
  *G01R 33/02* (2006.01)

(56) References Cited

U.S. PATENT DOCUMENTS

| | | |
|---|---|---|
| 10,429,538 B1 | 10/2019 | Venezia et al. |
| 2012/0326707 A1 | 12/2012 | Webb et al. |
| 2014/0081574 A1* | 3/2014 | Hove .................. E21B 7/04 702/6 |
| 2016/0195632 A1 | 7/2016 | Pai et al. |
| 2018/0329106 A1 | 11/2018 | Lindqvist et al. |

OTHER PUBLICATIONS

International Search Report and Written Opinion dated Sep. 19, 2023, issued in corresponding International Patent Application No. PCT/US2022/035060.

Widrow et al., Eds., Adaptive Signal Processing, Chapter 9: Adaptive Modeling and System Identification, Prentice-Hall PTR (1985), pp. 195-230.

Dean, "Turbulent and Electromagnetic Signature of Small- and Fine-scale Biological and Oceanographic Processes", Ph.D Dissertation, Nova Southeastern University (2019) (available at https://nsuworks.nova.edu/occ_stuetd/492/).

"Magnetic Total Field", from Explore the new Oilfield Glossary [Online]. Schlumberger Ltd {2021}. Retrieved from the Internet: <URL:www.glossary.oilfield.slb.com>.

G-822/G-823, Magnetometer Manual 2004; Operational Manual, Geometrics, Inc., 2190 Fortune Drive, San Jose, CA 95131 USA.

Kluge et al., "Analysis of the Magnetic Signature of Surface Waves Measured in a Laboratory Experiment", J. of Atmospheric and Oceanic Technology, vol. 39, 641-648 (May 2022), DOI: https://doi.org/10.1175/JTECH-D-21-0041.1.

Pendry et al., "Controlling Electromagnetic Fields", Science, vol. 312, issue 5781, pp. 1780-1782 (2006).

Podney, "Electromagnetic Fields Generated by Ocean Waves", J. of Geophysical Research, vol. 80, No. 21, 2977-2990 (1975).

Sharma, "Magnetic Method Applied to Mineral Exploration", Ore Geology Reviews 2, 323-357 (1987).

Soloviev et al., "A Near-Surface Microstructure Sensor System Used during TOGA COARE. Part II: Turbulence Measurements", J. of Atmospheric and Oceanic Technology, vol. 16, 1598-1618 (Nov. 1999), DOI: https://doi.org/10.1175/1520-0426(1999)016<1598:ANSMSS>2.0.CO;2.

Soloviev et al., "Evaluation of Magnetic Field Variations Induced by Submesoscale Processes in the Shallow Water Ocean Environment." OCEANS 2018 MTS/IEEE Charleston, 2018, pp. 1-6, doi: 10.1109/OCEANS.2018.8604583.

* cited by examiner

DETECTION OF FERROMAGNETIC OBJECTS SUBMERGED IN A BODY OF WATER

RELATED APPLICATION DATA

This application is based on and claims the benefit of priority to U.S. Provisional Application No. 63/259,214 filed on Jun. 29, 2021, the entire contents of which are incorporated herein by reference.

STATEMENT REGARDING FEDERALLY SPONSORED RESEARCH OR DEVELOPMENT

The invention was made with government support under Cooperative Agreement N00421-15-2A001 awarded by NAVAIR. The Government has certain rights in this invention.

TECHNICAL FIELD AND INDUSTRIAL APPLICABILITY

The present disclosure relates generally to systems and methods to detect magnetic anomalies. In particular, systems and methods are disclosed that remove various contributions to a detected magnetic field and then processes and analyzes the magnetic field for one or more of spatial and temporal variations that are then correlated to a ferromagnetic object. The systems and methods of the present disclosure can be used to identify non-naturally occurring ferromagnetic objects that are submerged in a body of water.

BACKGROUND

In the discussion that follows, reference is made to certain structures and/or methods. However, the following references should not be construed as an admission that these structures and/or methods constitute prior art. Applicant expressly reserves the right to demonstrate that such structures and/or methods do not qualify as prior art against the present invention.

Magnetic surveillance of unwanted objects depends on distinguishing between natural and non-naturally occurring, i.e., man-made, sources of magnetic signal. Current magnetic surveillance systems and methods account for sources of magnetic field variability, including solar wind (a temporal variable), naturally occurring ferromagnetic materials, such as geological structures, and ocean circulation (a spatial and temporal variable). However, the current magnetic surveillance systems and methods can be improved, particular for application to the magnetic surveillance of unseen objects, such as those submerged in bodies of water.

SUMMARY

Conventional systems and methods to detect ferromagnetic objects, particularly submerged, non-naturally occurring ferromagnetic objects, do not account for contributions to the magnetic field arising from topography, such as magnetic refraction at bathymetric slopes. Thus, disclosed methods and systems remove this topography component of noise from detected total magnetic field and enhance detection capability of, for example, naval surveillance systems.

An embodiment of a method to detect a ferromagnetic object comprises passively detecting a total magnetic field with a surveillance system including a magnetic sensor; removing noise from the detected total magnetic field to obtain a noise-removed magnetic field, wherein the noise includes one or more of: (i) a time varying component based on solar flares; (ii) a time varying component based on ocean current, (iii) a topography component based on magnetic refraction, and (iv) a geological component based on a ferromagnetic geological structure; analyzing the corrected total magnetic field for a variation, wherein the variation includes one or more of a spatial variation and a temporal variation; and correlating the variation to the ferromagnetic object, wherein the ferromagnetic object is non-naturally occurring, and the ferromagnetic object is submerged in a body of water.

An embodiment of a method to detect a non-naturally occurring ferromagnetic object submerged in water comprises the following steps: noise reduction of a time varying component based on solar flares; optional noise reduction of an ocean current magnetic signature; noise reduction of a spatially varying component based on an effect of magnetic refraction; noise reduction of a spatially varying component based on a ferromagnetic geological structure; identifying a magnetic feature that changes in time or space as compared to a prior magnetic survey; and attributing the identified magnetic feature to the non-naturally occurring ferromagnetic object submerged in water.

The disclosure follows the terminology of Geometrics, Inc. by defining the total magnetic field as the magnitude of the magnetic field vector (see G-822/G-823, Magnetometer Manual 2004; Operational Manual, Geometrics, Inc., 2190 Fortune Drive, San Jose, CA 95131 USA). The term "total magnetic field" is also referred to as the magnetic total field (see 2 "Explore the new Oilfield Glossary" at www.glossary.oilfield.slb.com, Schlumberger Ltd {2021}). The spatial surveillance magnetic systems typically utilize, but may not be limited to total magnetic field sensors but not excluding possible measurements of the magnetic field vector component sensors.

BRIEF DESCRIPTION OF THE DRAWING

The following detailed description of preferred embodiments can be read in connection with the accompanying drawings in which like numerals designate like elements and in which.

DETAILED DESCRIPTION

Figure 1:
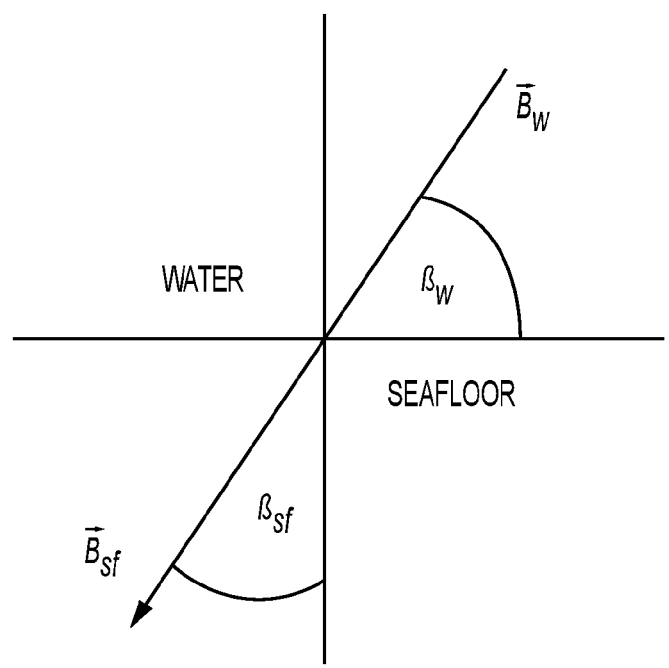
FIG. 1 is a schematic representation of the magnetic induction at the water-seafloor interface.

Embodiments of magnetic surveillance systems and methods account for sources of magnetic field variability, including solar wind (a temporal variable), naturally occurring ferromagnetic materials, such as geological structures, and ocean circulation (a spatial and temporal variable), and topography magnetic refraction component(s). Thus, in one embodiment, magnetic surveillance systems and methods include removing noise from a detected total magnetic field to obtain a noise-removed magnetic field, where the noise includes one or more of the following: a geological component based on a ferromagnetic geological structure, a time varying component based on solar radiation, a time varying component based on ocean current, and a topography magnetic refraction component.

For example, after removing the magnetic noise produced by solar flares, ocean current features, and magnetic refraction at the bottom topography, the noise from the geological component(s) based on a ferromagnetic geological structure can be identified empirically using magnetic surveying techniques and removed from the measured magnetic field. Both the non-varying nature of magnetic anomalies from ferromagnetic geological structures and the recognizable decay of such magnetic anomalies can be used to identify the contributions to the detected total magnetic field from geological component(s) based on a ferromagnetic geological structure. Once identified, such a contribution can be removed from the detected total magnetic field. In other words, once the magnetic noise from geological component(s) based on a ferromagnetic geological structure is known, its contribution to the detected total magnetic field can be removed, for example, by signal processing methods.

For example, the magnetic noise from geological component(s) based on a ferromagnetic geological structure can be identified empirically using magnetic surveying techniques. Prior geological surveys can be used to identify such ferromagnetic geological structures, where known. A magnetic sensor, such as a magnetic sensor in a manned or remotely operated aircraft, watercraft, or underwater craft, can then pass within proximity of the ferromagnetic geological structure and record the magnetic field. The recorded magnetic field from multiple passes are then analyzed and the non-charging components are identified and correlated to the ferromagnetic geological structure being surveyed.

Also for example, the magnetic noise from magnetic refraction on bottom topography can be calculated by correlating the measured magnetic signal with the bottom topography slopes or using a computation model (e.g., ANSYS Maxwell, see FIGS. 2-4) based on the known bottom topography in the area of interest.

In each of the above techniques, to determine magnetic anomalies associated with ferromagnetic geological structures, the magnetic anomaly information for a particular ferromagnetic geological structure can be stored, such as in a database, for future reference. During future operations in areas with stored magnetic anomaly information for a ferromagnetic geological structure, the stored magnetic anomaly information can be accessed and used to correct the detected total magnetic field.

In another example, the contribution to detected total magnetic field from solar flares can be a source of significant magnetic anomalies in the detected total magnetic field. Magnetic anomalies from solar flares are temporal and can vary in time. A magnetic sensor located at a fixed nearby location (e.g., a land-based sensor) can provide the reference magnetic field to compensate for the solar flares. Comparing a detected total magnetic field at 4 a given location and comparing it to a detected total magnetic field at the nearest one or nearest two fixed locations allows for identification of the temporal component in the detected magnetic field that is associated with solar flares. Once identified, such a contribution can be removed from the detected magnetic field. In other words, once the magnetic noise from solar flares is known, its contribution to the detected magnetic field can be removed, for example, by signal processing methods. Because of the temporal nature, the correction to account for magnetic anomalies due to solar flares can be adjusted and updated in real-time.

In another example, the contribution to detected total magnetic field from ocean currents can be a source of magnetic anomalies in the detected total magnetic field. The magnetic field from ocean currents is a secondary magnetic field. Therefore, accounting for the contribution to detected total magnetic field from ocean currents can be optional in the detection methods disclosed herein. However, if included, magnetic anomalies from ocean current can be determined using algorithms. For example, the algorithm by Podney (Podney, Electromagnetic Fields Generated by Ocean Waves, Journal of Geophysical Research, vol. 80, no. 21, 2977-2990 (1975), the entire disclosure of which is incorporated herein by reference) can use information from an ocean current velocity sensor, e.g., an acoustic Doppler current velocity profiler, to calculate an expected magnetic anomaly from ocean currents at a particular location or area. An electromagnetic computer model (e.g., A Soloviev and C. Dean, "Evaluation of Magnetic Field Variations Induced by Submesoscale Processes in the Shallow Water Ocean Environment." OCEANS 2018 MTS/IEEE Charleston, 2018, pp. 1-6, doi: 10.1109/OCEANS.2018.8604583, the entire disclosure of which is incorporated herein by reference) can be used to calculate an expected magnetic anomaly from ocean currents. Once calculated, such a contribution can be removed from the detected total magnetic field. In other words, once the magnetic noise from ocean currents is known, its contribution to the detected total magnetic field can be removed, for example, by signal processing methods. This correction can be fixed or temporal and, if temporal, the correction to account for magnetic anomalies due to ocean currents can be adjusted and updated in real-time.

To the above sources of noises and systems and methods to correct for such noise, embodiments of magnetic surveillance systems and methods can also account for magnetic anomalies due to topography, such as magnetic refraction at bathymetric slopes. Analytical estimates and computer modeling results based on known science (e.g., Pendry et al., Controlling Electromagnetic Fields, Science, vol. 312, issue 5781, pp. 1780-1782 (2006), the entire disclosure of which is incorporated herein by reference). Demonstrate that its effects on surveillance of ferromagnetic objects can be substantially more than solar flares or ocean current effects. Magnetic anomalies due to topography arise from the difference in permeability between two materials, which results in the effect of magnetic field refraction. This effect is schematically illustrated in FIG. 1, which is a schematic representation of the magnetic induction at the water-seafloor interface. The incorporation of the known effect of magnetic refraction into existing surveillance methods is the subject of the current disclosure.

In FIG. 1, $B_w$ is the magnetic total field above the interface (i.e., in the water), $B_{sf}$ is the magnetic total field below the interface (i.e., in the seafloor), $\theta_w$ is the inclination angle above the interface, and $\theta_{sf}$ is the inclination angel below the interface. The boundary conditions on magnetic field at the seafloor for the magnetic induction and magnetic field strength are as follows:

$$B_{wn} = B_{sf} \text{ and } H_{wt} = H_{sft} \qquad (1)$$

where $B_{wn}=B_w \cos \theta_w$ is the normal component of the magnetic total field above the interface, $B_{sfn}=B_{sf} \cos \theta_{sf}$ is the normal component of the magnetic total field below the interface, $H_{wt}$ is the tangential component of the magnetic field strength above the interface, and $H_{sft}$ is the tangential component of the magnetic field strength below the interface. In the absence of magnetization, $B=H\mu_0\mu$, where $\mu_0$ is the vacuum permeability and $\mu$ is the relative permeability.

Introducing the magnetic susceptibility of water and seafloor material as $\chi_w=\mu_w-1$ and $\chi_{sf}=\mu_{sf}-1$, where $\mu_w$ is the water relative permeability and $\mu_{sf}$ is the seafloor relative permeability, Eq. (1) transforms into the following relationship:

$$B_w \cos\theta_w = B_{sf} \cos\theta_{sf} \quad (2)$$

$$B_w(1+\chi_w)\sin\theta_w = B_{sf}(1+\chi_{sf})\sin\theta_{sf} \quad (3)$$

Eqs. (2) and (3) lead to the following equation for the total magnetic field anomaly due to magnetic refraction:

$$\Delta B = (B_w - B_{sf}) = \left[B_{sf}(\cos\theta_{sf}/\cos\theta_w - 1)\right] \quad (4)$$

where:

$$\theta_w = \arctan\left[\tan\theta_{sf}(1+\chi_{sf})/(1+\chi_w)\right]$$

$$\tan\theta_{sf} = \alpha/L$$

-continued $\alpha$ = bottom elevation amplitude (meters)

$L$ = spatial periodicity (wavelength)

Figure 2:
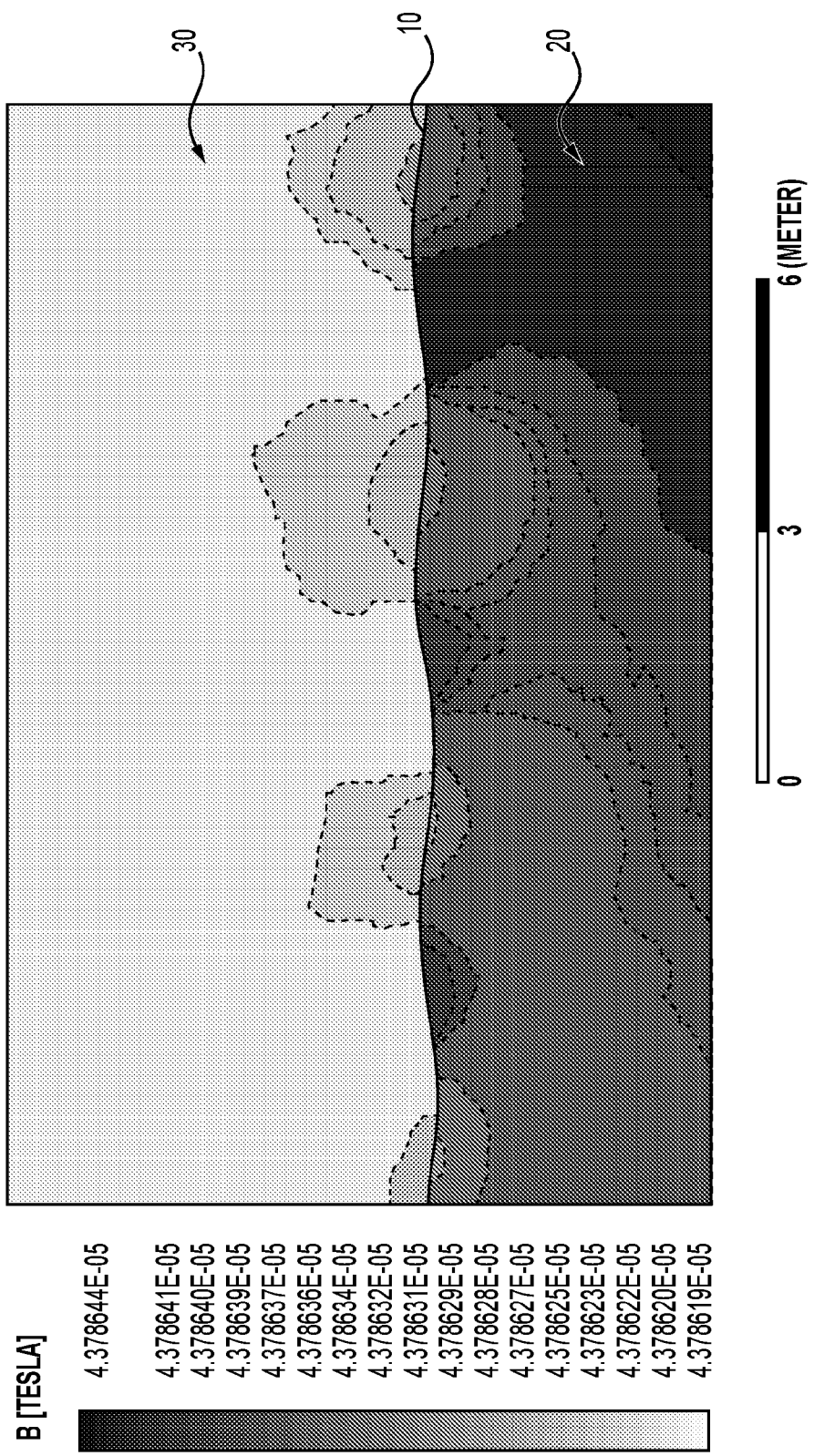
FIGS. 2 to 4 illustrate spatial distortion of the Earth's magnetic field at the water-seafloor boundary for different seafloor materials and for different bottom topographies.
Figure 3:
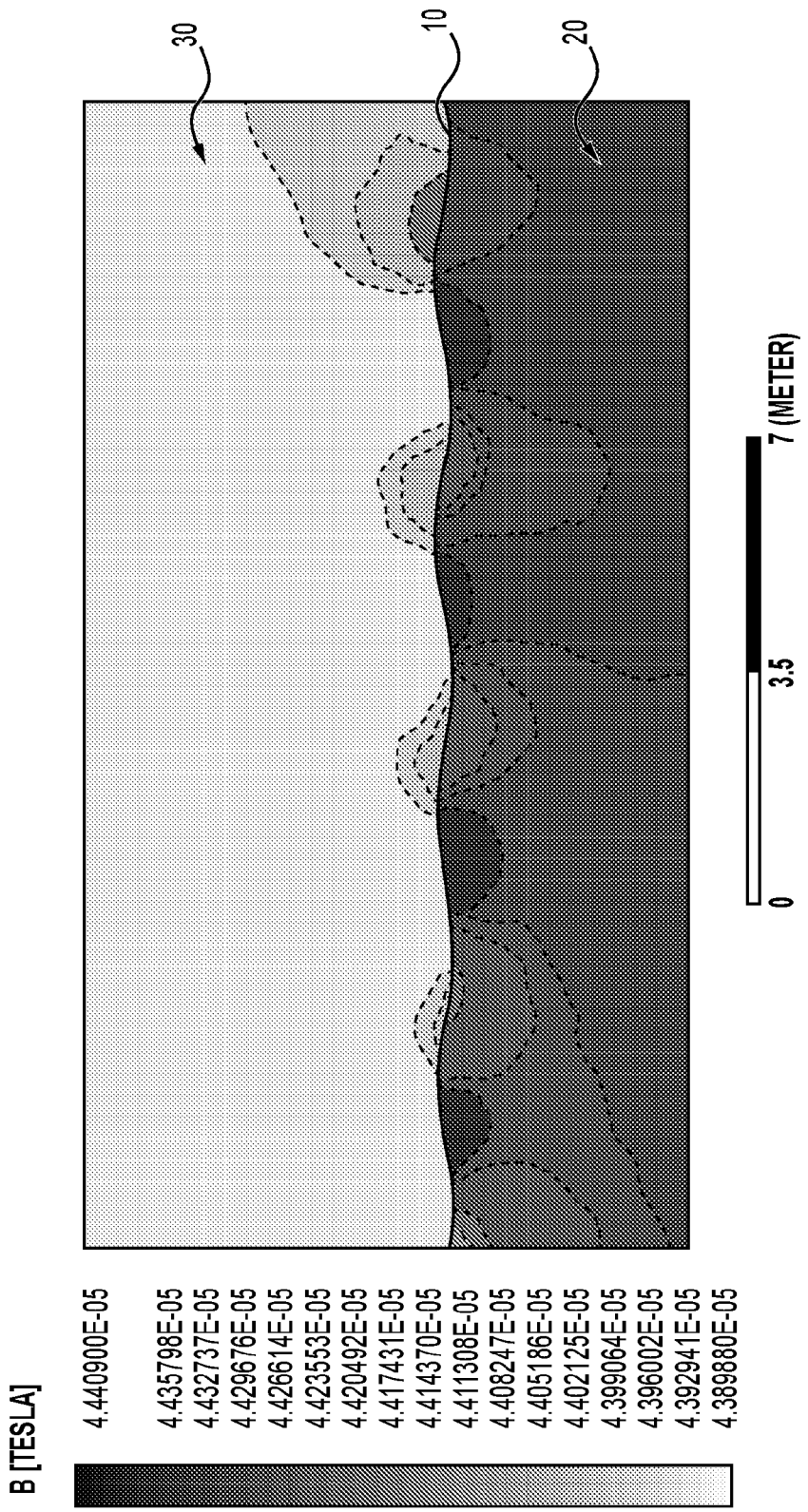
Figure 4:
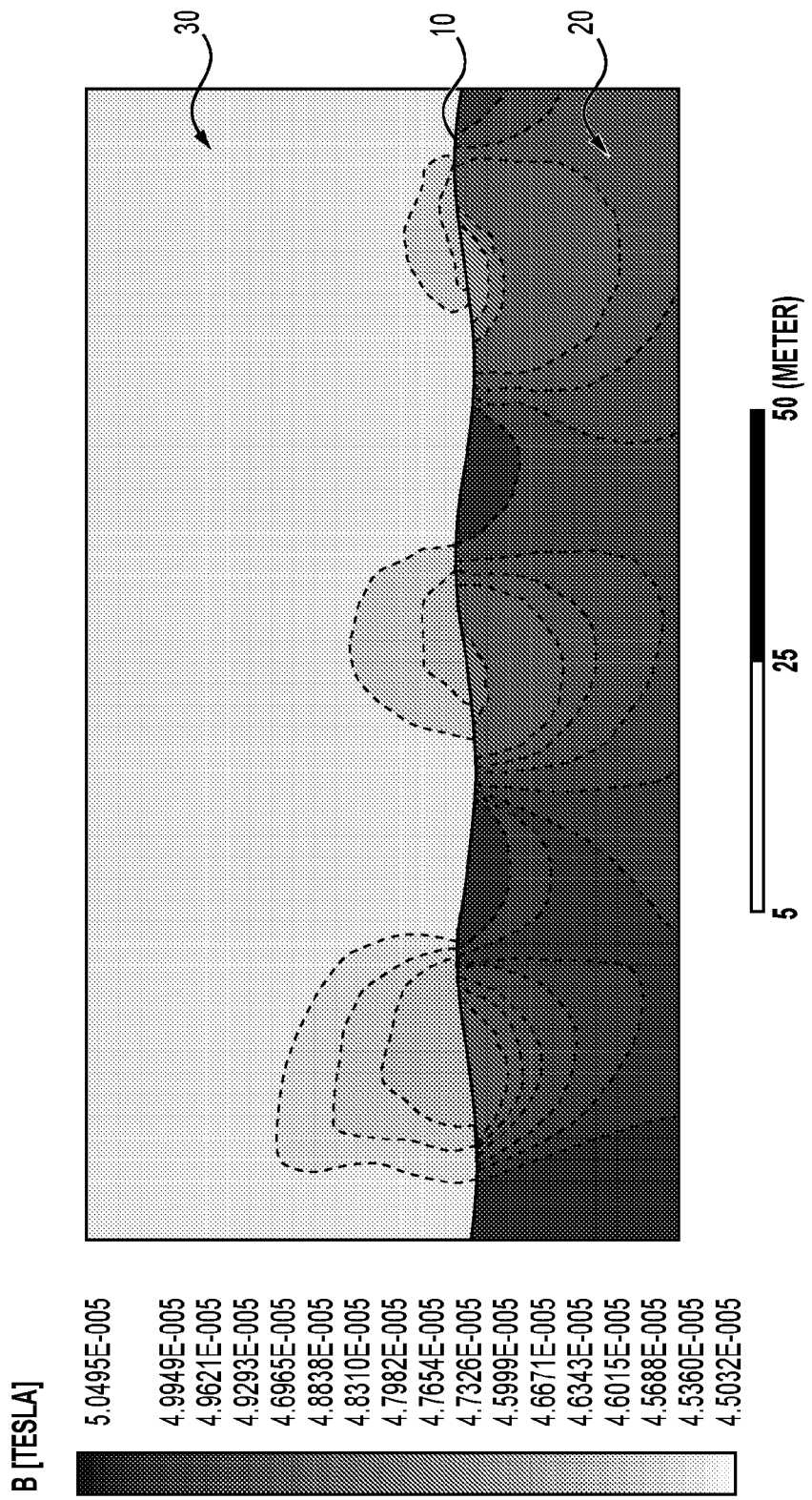

For simplicity, periodic bottom elevation has been considered as shown in FIGS. 2-4.

Spatial anomalies of the total magnetic field at the seafloor due to the difference in magnetic permeability between the water and the seafloor materials and bottom topography, i.e., shape) were explored using the analytical model in Eq. (4) and a known computation model (ANSYS Maxwell) (see ANSYS Manual). FIGS. 2 to 4 illustrate spatial distortion of the Earth's magnetic field at the water-seafloor boundary 10 (i.e., the boundary between the seafloor 20 and the water 30) for different seafloor materials and for different bottom topographies using this model. FIGS. 2 to 4 report spatial distortion of the Earth's magnetic field in nT (see legend in each figure). In the example shown in FIGS. 2 and 3, the bottom topography is modeled as a sinusoidal wave (amplitude is $\alpha=0.1$ m and the spatial periodicity is L=4 m). In the example shown in FIG. 4, the bottom topography is also modeled as a sinusoidal wave (amplitude is $\alpha=1.0$ m and the spatial periodicity is L=40 m). The bottom materials are limestone (sediment) (FIGS. 2 and 3) and igneous seafloor (FIG. 4). The range of the relative magnetic permeability for limestone is from 1.000002 to 1.025 and the range of the relative magnetic permeability for igneous rock is from 1.0027 to 1.27. The anomaly of the total magnetic field for limestone is from 0.25 nT to 510 nT and the anomaly of the total magnetic field for igneous rock is from 54 nT to 5337 nT. These values are also presented in Table 1.

Table 1 and FIGS. 2-4 show the effects of magnetic refraction at the sea floor for two different sea floor materials and for a sinusoidal-shape sea floor profile. Table 1 includes values for magnetic anomaly due to magnetic refraction for different seafloor materials. These values have been determined using the analytical model in Eq. (4) and using the ANSYS Maxwell computational model (using FIGS. 2-4). For all cases here, the Earth's total magnetic field was $B_{sf}$=43926 nT and inclination angle was $\theta_{sf}$=54 degrees. The inclination angle over the periodic sea bottom profile (both with $\alpha$=0.1 m and L=4 m and with $\alpha$=1.0 m and L=40 m) varies±9 degrees, in the range of 45 degrees to 63 degrees. These angel variations have been considered in the analytical model (Eq. (4)) and the magnetic anomaly determined (see Table 1, third and fourth column) for the different seafloor materials with different magnetic permeability (see Table 1, second column). The results from the ANSYS Maxwell computational model (see Table 1, fourth column) and the results from the analytical model (Eq. (4)) (see Table 1, third column) are consistent with each other and demonstrate a magnetic refraction can be a significant contribution to magnetic field noises.

TABLE 1

| Seafloor Material | Relative Permeability | Magnetic Anomaly from the Analytical model (Eq. (4)) | Magnetic Anomaly from ANSYS Maxwell Computational Model |
| --- | --- | --- | --- |
| Limestone | 1.000002 to 1.025 | 0.25 to 510 | 0.24 to 551 |
| Igneous Rock | 1.0027 to 1.27 | 54 to 5337 | 59 to 6266 |

FIGS. 2 to 4 each illustrate spatial distortion of the Earth's magnetic field at the water-seafloor boundary modeled with the ANSYS Maxwell software and for different seafloor materials and for different bottom topographies. In FIG. 2 the seafloor material is limestone with a relative magnetic permeability of 1.000002. An inclination angle of the Earth's magnetic field is 54 degrees. The difference between the maximum and the minimum in total magnetic field (magnetic anomaly) associated with the FIG. 2 bottom topography is 0.25 nT. FIG. 3 has similar parameters as those for FIG. 2, except that in FIG. 3 the seafloor material is limestone with a relative magnetic permeability of 1.025. The difference between the maximum and the minimum in total magnetic field (magnetic anomaly) associated with the FIG. 3 bottom topography is 510 nT. FIG. 4 also has similar parameters as those for FIG. 1, except that in FIG. 4 the seafloor material is igneous rock with a relative magnetic permeability of 1.27 and the size of the domain and wave representing the bottom topography has been increased proportionally by a factor of 10. The difference between the maximum and the minimum in total magnetic field (magnetic anomaly) associated with the FIG. 4 bottom topography is 5337 nT.

According to the ANSYS Maxwell model (see FIGS. 2-4), the magnetic anomaly due to magnetic refraction on the slope regions of the bottom topography (i.e., not at the apogee and perigee of the sinusoidal wave) extends vertically in a direction of the inclination angel of the Earth's magnetic field, to the distance of approximately one wavelength. The bottom topography in the ocean can be represented as a sum of Fourier harmonics and the magnetic fields anomalies corresponding to each of these harmonics will be exponentially decaying according to the harmonic wavelength. As a result, the variability of the total magnetic field induced by the bathymetric slopes will depend on the strength and orientation of the Earth's magnetic field at the geographic location and on the distance between the bottom surface, i.e., seafloor, and the location of the magnetic field sensor (e.g., a magnetic sensor on an aircraft, watercraft, or underwater craft). The distance between the bottom surface and the location of the magnetic field sensor is also referred to herein as the altitude of the magnetic senor.

Taken together, the total magnetic field passively detected by a magnetic sensor of a surveillance system can be represented by the following:

Total Magnetic Field = (Magnetic Field from solar flares) + (5)

(Magnetic Field from ocean currents) +

(Magnetic Field from refraction on topography) +

(Magnetic Field from geological component based on a ferromagnetic gelogical structure) +

(Magnetic Field from non-naturally occurring, ferromagnetic object)

Relatedly, a noise removed magnetic field can be obtained by removing, such as by signal processing or other subtractive technique, from a detected total magnetic field, the contribution to the detected total magnetic field from one or more of the following: (i) a geological component based on a ferromagnetic geological structure, (ii) a time varying component based on solar radiation, (iii) a time varying component based on ocean current, and (iv) a topography component. The noise removed magnetic field can be obtained by a process 100, such as that set forth in the diagram in FIG. 5. The noise reduction procedure (FIG. 5) involves the following steps: (1) passively detecting magnetic field using a magnetic sensor S105; (2) removing time varying noise components from solar flares and (optionally) the ocean current circulation magnetic signature S110; (3) removing spatially varying noise components from the effect of magnetic refraction of the Earth's magnetic field on the bottom topography slopes S115; (4) removing spatially varying noise from the component on ferromagnetic geological structures S120; and (5) comparing a plurality of magnetic fields to identify one or more "new" magnetic field anomalies S125. In other words, once the various naturally occurring variations are removed from the magnetic field, then the resultant Noise Reduced Magnetic Field is proportional to the magnetic field attributable to any non-naturally occurring ferromagnetic object, such as a shipwreck, sunken cargo, or underwater vehicles, such as submarines or unmanned underwater vehicles.

Furthermore, if any of the non-naturally occurring sources have a varying component, such as a spatial or temporal component, which would be indicative of, e.g., a moving underwater vehicle, such variation will be readily detectable by analysis of the Noise Reduced Magnetic Field. For example, at step (3) in FIG. 5, a coherent noise cancellation technique can be applied to the noise-removed magnetic field to obtain a corrected total magnetic field. An example coherent noise cancellation technique is one based on the nonlinear Wiener filter. A suitable noise cancellation technique based on the nonlinear Wiener filter is disclosed in Widrow et al, Adaptive Signal Processing, Prentice-Hall (1985), Schoeberlein et al, Status Report: Reduction of Motion Contamination in TOGA COARE Velocity Measurements, Johns Hopkins University Tech. Rep. STF-96-104 (1996) (available from Applied Physics Lab, JHU), and Soloviev et al, J. of Atmospheric and Oceanic Technology, 16, 1598-1618 (1999), the entire disclosure of each of these are incorporated herein by reference.

The corrected magnetic field is then analyzed for variations, such as a spatial variation, a temporal variation, or a combination thereof. For example, using successive aerial magnetic surveys with Geometrics, Inc. total magnetic sensors, a land-based reference magnetometer can be used for removal of the magnetic noise from solar flares. An ocean circulation magnetohydrodynamics model (e.g., A Soloviev and C. Dean, "Evaluation of Magnetic Field Variations Induced by Submesoscale Processes in the Shallow Water Ocean Environment." OCEANS 2018 MTS/IEE Charleston, 2018, pp. 1-6, doi: 10.1109/OCEANS.2018.8604583 and Dean, Turbulent and Electromagnetic Signature of Small- and Fine-scale Biological and Oceanographic Processes, Ph.D Dissertation, Nova Southeastern University (2019) (available at https://nsuworks.nova.edu/occ_stuetd/492/), the entire disclosure of each of these are incorporated herein by reference) calculating magnetic signature of the ocean current circulation features (e.g., internal wave solitons) can be applied to remove the noise from the ocean circulation features. The magnetohydrodynamic model can work assimilating data from a mooring or a plurality of moorings. The magnetic refraction noise is removed by correlating the magnetometer signal with the bottom topography slopes using non-linear noise cancellation techniques, e.g., Winer filter. After removing the magnetic noises from solar flares, ocean current circulation features, and the magnetic refraction, the magnetic field date can be useful for mineral and hydrocarbon exploration (S140; see FIG. S), in combination with gravity and other known non-magnetic methods relevant to geophysics exploration. Finally, removal of the spatial magnetic field variability from ferromagnetic geological structures using a singular or plurality of successive magnetic surveys, such as from aeromagnetic or ocean towed magnetic sensors, will clear the detected magnetic field from the above identified noises.

Figure 5:
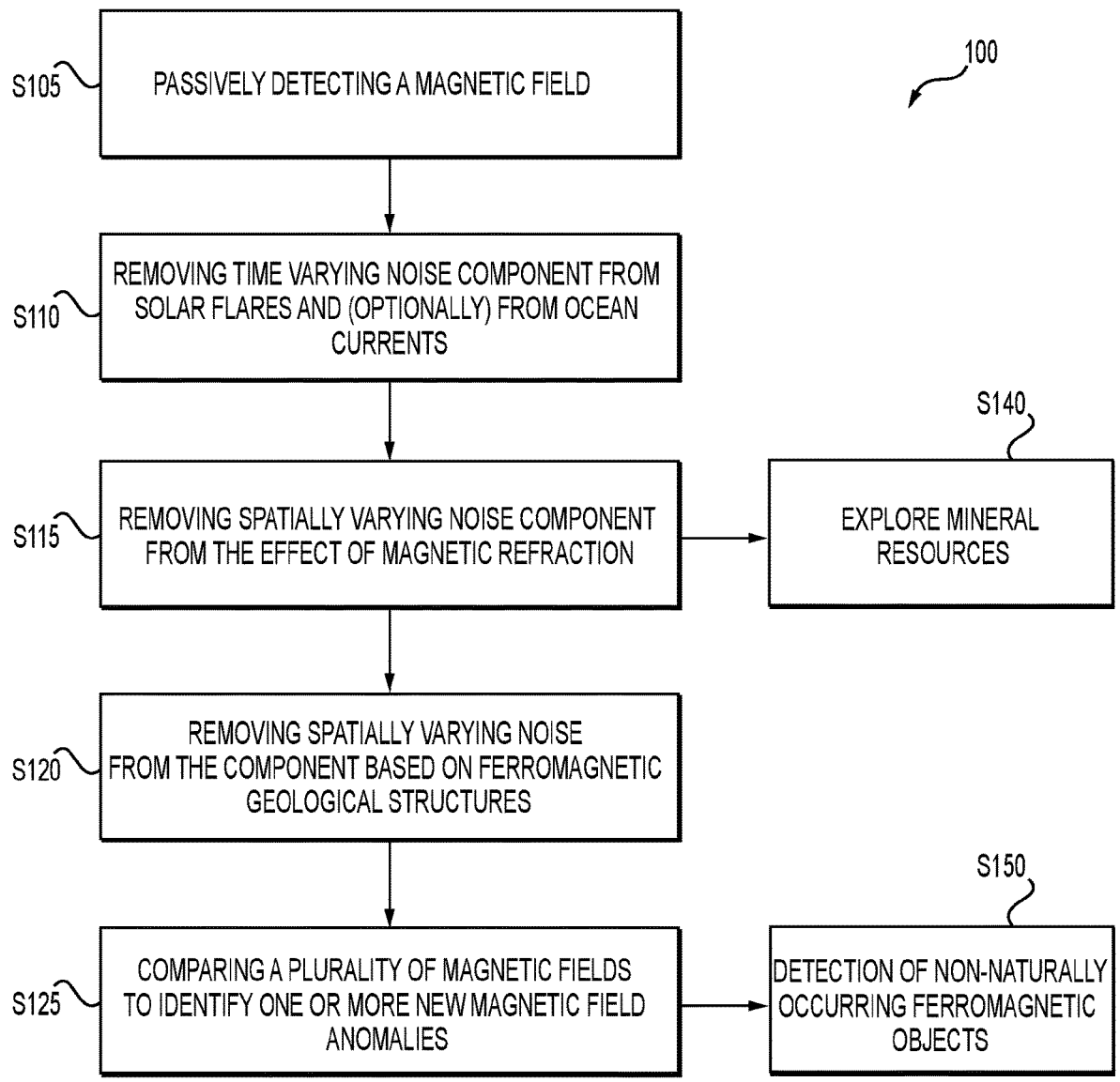
FIG. 5 shows a sequence of steps in a processing algorithm and related applications.

Once identified, the above-described magnetic noises are removed from the measured magnetic field and the variations during successive magnetic surveys (applying the cancellation techniques as shown in FIG. 5) are then assigned to a non-naturally occurring, ferromagnetic object that is located submerged in the body of water from which the magnetic readings were obtained (5150, see FIG. 5).

Other applications include the exploration of mineral and hydrocarbon resources. After removing magnetic noises from solar flares, (optional) ocean currents features, and magnetic refraction, the magnetic field can be useful for mineral and hydrocarbon exploration (FIG. 5) (see Sharma, Magnetic Method Applied to Mineral Exploration, Ore Geology, Review 2, 323-357 (1987), the entire disclosure of which is incorporated herein by reference) in combination with gravity and other known non-magnetic methods relevant to geophysics exploration.

While reference has been made to specific embodiments, it is apparent that other embodiments and variations can be devised by others skilled in the art without departing from their spirit and scope. The appended claims are intended to be construed to include all such embodiments and equivalent variations.

What is claimed is:

1. A method to detect a ferromagnetic object, the method comprising:
    passively detecting a total magnetic field with a surveillance system including a magnetic sensor;
    removing noise from the detected total magnetic field to obtain a noise removed magnetic field, wherein removing the noise comprises: applying a coherent noise cancellation filter to eliminate a spatially varying magnetic refraction component by comparing a magnetic field sensor signal with slopes of ocean bottom topography and removing one or more correlated components from the magnetic sensor signal, and wherein the magnetic refraction component is caused by interaction between the Earth's magnetic field and the ocean bottom topography;
removing one or more additional noise components selected from:
a time varying component based on solar flares,
a time varying component based on ocean current, and
a geological component based on a ferromagnetic geological structure;
analyzing the noise removed magnetic field for a variation, wherein the variation includes one or more of a spatial variation and a temporal variation; and
correlating the variation to the ferromagnetic object,
wherein the ferromagnetic object is non-naturally occurring, and
wherein the ferromagnetic object is submerged in a body of water.

2. The method according to claim 1, wherein, when the noise includes the time varying component based on solar flares, the step of removing noise from the detected total magnetic field includes comparing a plurality of passively detected total magnetic field to a baseline solar radiation signal from a reference station.

3. The method according to claim 2, wherein the reference station is a land-based magnetometer.

4. The method according to claim 1, wherein, when the noise includes the time varying component based on ocean current, the step of removing noise from the detected total magnetic field includes comparing the detected total magnetic field to a baseline ocean current signal from an ocean current sensor.

5. The method according to claim 4, wherein the time varying component based on ocean current is calculated by a magnetohydrodynamics model assimilating ocean current data from a buoy or a plurality of ocean buoys.

6. The method according to claim 1, wherein, when the noise includes the geological component based on a ferromagnetic geological structure, the step of removing noise from the detected total magnetic field includes comparing the detected total magnetic field to a baseline geological signal from a reference survey.

7. The method of claim 6, wherein the reference survey is a prior geological survey used to identify ferromagnetic geological structures.

8. The method of claim 1, wherein the coherent noise cancellation filter is based on a nonlinear Wiener filter.

9. The method of claim 1, wherein analyzing the noise removed magnetic field comprises comparing successive magnetic surveys.

10. A method to detect a non-naturally occurring ferromagnetic object submerged in water, the method comprising the following steps:
noise reduction of a time varying component based on solar flares;
noise reduction of an ocean current magnetic signature;
noise reduction of a spatially varying component based on an effect of magnetic refraction;
noise reduction of a spatially varying component based on a ferromagnetic geological structure;
identifying a magnetic feature that changes in time or space as compared to a prior magnetic survey; and
attributing the identified magnetic feature to the non-naturally occurring ferromagnetic object submerged in water.

11. A method to detect a ferromagnetic object, the method comprising:
passively detecting a total magnetic field with a surveillance system including a magnetic sensor;
removing noise from the detected total magnetic field to obtain a noise removed magnetic field, wherein the noise includes one or more of:
a time varying component based on solar flares,
a time varying component based on ocean current,
a topography component based on magnetic refraction, and
a geological component based on a ferromagnetic geological structure;
analyzing the noise removed magnetic field for a variation, wherein the variation includes one or more of a spatial variation and a temporal variation; and
correlating the variation to the ferromagnetic object,
wherein the ferromagnetic object is non-naturally occurring,
wherein the ferromagnetic object is submerged in a body of water,
wherein, when the noise includes the time varying component based on solar flares, the step of removing noise from the detected total magnetic field includes comparing a plurality of passively detected total magnetic field to a baseline solar radiation signal from a reference station,
wherein, when the noise includes the time varying component based on ocean current, the step of removing noise from the detected total magnetic field includes comparing the detected total magnetic field to a baseline ocean current signal from an ocean current sensor,
wherein a coherent noise cancellation filter is applied to a magnetic field sensor signal to eliminate a spatially varying noise from magnetic refraction due to ocean bottom topography, and
wherein, when the noise includes the geological component based on the ferromagnetic geological structure, the step of removing noise from the detected total magnetic field includes comparing the detected total magnetic field to a baseline geological signal from a reference survey.

12. The method according to claim 11, wherein the reference station is a land-based magnetometer.

13. The method according to claim 11, wherein the time varying component based on ocean current is calculated by a magnetohydrodynamics model assimilating ocean current data from a buoy or a plurality of ocean buoys.

14. The method of claim 11, wherein the spatially varying noise from magnetic refraction due to ocean bottom topography is eliminated by comparing the magnetic field sensor signal with slopes of the ocean bottom topography and removing one or more correlated components from the magnetic sensor signal.

15. The method according to claim 11, wherein the reference station is a land-based magnetometer,
wherein the time varying component based on ocean current is calculated by a magnetohydrodynamics model assimilating ocean current data from a buoy or a plurality of ocean buoys, and
wherein the spatially varying noise from magnetic refraction due to ocean bottom topography is eliminated by comparing the magnetic field sensor signal with slopes of the ocean bottom topography and removing one or more correlated components from the magnetic sensor signal.

16. The method of claim 11, wherein the reference survey is a prior geological survey used to identify ferromagnetic geological structures.

\* \* \* \* \*